(12) United States Patent
Ogawa et al.

(10) Patent No.: US 9,197,201 B2
(45) Date of Patent: Nov. 24, 2015

(54) IMPULSE VOLTAGE GENERATION DEVICE

(71) Applicants: TOSHIBA MITSUBISHI-ELECTRIC INDUSTRIAL SYSTEMS CORP., Chuo-ku (JP); KABUSHIKI KAISHA TOSHIBA, Minato-ku (JP)

(72) Inventors: Hiroyuki Ogawa, Tokyo (JP); Takayuki Sakurai, Tokyo (JP); Tetsuo Yoshimitsu, Tokyo (JP); Tatsuya Hirose, Inagi (JP); Satoshi Hiroshima, Kawasaki (JP); Masayuki Hikita, Fukuoka-ken (JP); Masahiro Kozako, Fukuoka-ken (JP); Takahisa Ueno, Oita-ken (JP)

(73) Assignees: TOSHIBA MITSUBISHI-ELECTRIC INDUSTRIAL SYSTEMS CORPORATION, Chuo-ku (JP); KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/294,237

(22) Filed: Jun. 3, 2014

(65) Prior Publication Data

US 2014/0292382 A1    Oct. 2, 2014

Related U.S. Application Data

(63) Continuation of application No. PCT/JP2012/008099, filed on Dec. 19, 2012.

(30) Foreign Application Priority Data

Dec. 20, 2011    (JP) .................................. 2011-278820

(51) Int. Cl.
*G05F 1/10* (2006.01)
*H03K 3/64* (2006.01)
(Continued)

(52) U.S. Cl.
CPC ........ *H03K 3/64* (2013.01); *G01R 31/14* (2013.01); *G01R 31/42* (2013.01); *H02M 3/07* (2013.01); *H03K 3/013* (2013.01); *G01R 31/001* (2013.01)

(58) Field of Classification Search
CPC ........ G01R 31/14; G01R 19/004; H02M 3/07
See application file for complete search history.

(56) References Cited

U.S. PATENT DOCUMENTS

| 2013/0057996 A1 | 3/2013 | Kamihara et al. |
| 2015/0015303 A1* | 1/2015 | Sakurai et al. ........... 324/765.01 |

FOREIGN PATENT DOCUMENTS

| JP | 10-335089 A | 12/1998 |
| JP | 2006-038471 A | 2/2006 |

(Continued)

OTHER PUBLICATIONS

International Search Report Issued on Apr. 2, 2013 for PCT/JP2012/008099 Filed on Dec. 19, 2012 with English Translation.
Yoshinobu Murakami, et al.,"First Round-Robin Test for Measurement of Partial Discharge Inception Voltage under Repetitive Impulse Voltage," 1-S2-9, 2010 IEE Japan, Mar. 5, 2010, pp. 33-36.

(Continued)

*Primary Examiner* — Karen Masih
(74) *Attorney, Agent, or Firm* — Oblon, McClelland, Maier & Neustadt, L.L.P.

(57) ABSTRACT

A signal generator generates a combined signal that is generated only in the period where supply of a pulse signal is effected, a pulse signal whose frequency is of a higher impulse repetition frequency than the frequency of the period setting signal and whose amplitude represents a voltage value that is lower than the high voltage HVDC value. A semiconductor switch accumulates electric charge on a capacitative element by means of the high voltage HVDC from the high voltage generator when the voltage value of the combined signal is lower than the set gate voltage value and generates an impulse voltage whose peak value is the value of the high voltage HVDC, by means of the electric charge that is discharged from the capacitative element when the voltage value of the combined signal exceeds the set gate voltage value.

10 Claims, 9 Drawing Sheets

(51) Int. Cl.
*G01R 31/14* (2006.01)
*H02M 3/07* (2006.01)
*H03K 3/013* (2006.01)
*G01R 31/42* (2006.01)
*G01R 31/00* (2006.01)

(56) References Cited

FOREIGN PATENT DOCUMENTS

| JP | 2006-38688 A | 2/2006 |
|----|--------------|--------|
| JP | 2006-098170 A | 4/2006 |
| JP | 2009-115505 A | 5/2009 |
| JP | 2011-002313 A | 1/2011 |
| JP | 2011-244639 A | 12/2011 |
| JP | 2013-002871 A | 1/2013 |

OTHER PUBLICATIONS

Office Action issued on Jul. 28, 2015 in Japanese Patent Application No. 2011-278820.

Office Action issued Apr. 22, 2015 in Korean Patent Application No. 10-2014-7019880.

Yun-Sik Jin, et al., "Performance of 2.4-MJ Pulsed Power System for Electrothermal-Chemical Gun Application" IEEE Transactions on Magnetics, vol. 39, No. 1, Jan. 2003, pp. 235-238.

Office Action issued Sep. 2, 2015 in Korean Patent Application No. 10-2014-7019880.

Sungwoo Bae, et al., "High-Power Pulse Generator With Flexible Output Pattern", IEEE Transactions on Power Electronics, vol. 25, No. 7, Jul. 2010, pp. 1675-1684.

\* cited by examiner

IMPULSE VOLTAGE GENERATION DEVICE

CROSS REFERENCES TO RELATED APPLICATIONS

This application is a continuation-in-part (CIP) application based upon the International Application PCT/JP2012/008099, the International Filing Date of which is Dec. 19, 2012, the entire content of which is incorporated herein by reference, and is based upon and claims the benefit of priority from the prior Japanese Patent Application No. 2011-278820, filed in the Japanese Patent Office on Dec. 20, 2011, the entire content of which is incorporated herein by reference.

FIELD OF THE INVENTION

The present invention relates to an impulse voltage generation device.

BACKGROUND OF THE INVENTION

Impulse voltage generation devices find applications in inverter drive systems comprising an electric motor, an inverter and a cable. In an inverter drive system, the inverter converts a DC voltage into a pulse voltage by means of a switching operation and supplies the pulse voltage to the motor by way of the cable. The motor is driven to operate by the pulse voltage.

However, in inverter drive systems, reflected waves are produced by impedance mismatching of the inverter, the cable and the motor. As a reflected wave comes to lie on the pulse voltage, high voltage noise can arise between the cable and the motor, particularly at the connecting section where the cable is connected to the motor. Such high voltage noise is referred to as "inverter surge" hereinafter for the purpose of discriminating it from lightning surge.

Tests for evaluating an inverter drive system are known where a simulated inverter surge is generated and applied to the connecting section as load are known. More particularly, there is a known test of repeatedly generating an impulse voltage as simulated inverter surge and alternately providing periods during which an impulse voltage is applied as load and periods during which no impulse voltage is generated. Impulse voltage generation devices that employ discharge gaps have been developed to realize such a test.

The impulse voltage generation device has a high voltage generator, a capacitive element, a first output terminal, a second output terminal, a first electrode and a second electrode.

The high voltage generator is arranged between a first node and a second node. The capacitive element, is arranged in parallel with the high voltage generator between the first node and the second node. Typically, a connecting section of the above-described type is provided between the first output terminal and the second output terminal as load to which an impulse voltage is supplied.

The first electrode and the second electrode are arranged between the first node and the first output terminal. The first electrode and the second electrode are typically spherical metal electrodes (made of tungsten or the like). The first electrode and the second electrode are arranged at positions that are separated from each other.

The high voltage generator generates a high voltage and electric charge is accumulated in the capacitive element due to the high voltages supplied from the high voltage generator. When the voltage between the first electrode and the second electrode gets to the spark discharge triggering voltage level, a spark discharge occurs to generate an impulse voltage between the first output terminal and the second output terminal. The peak value of the impulse voltage is determined by the spark discharge in the atmosphere. It is lower than the high voltage that the high voltage generator supplies.

An impulse voltage generation device that employs a discharge gap generates an impulse voltage by means of spark discharge. Therefore, the parameters including the voltage value of impulse voltage, the rising time, the falling time and the impulse repetition frequency can often fluctuate.

Spark discharge occurs in the atmosphere. Therefore, constant (air) pressure needs to be supplied between the first electrode and the second electrode in order to make the above parameters to be held to respective constant values. However, even if constant air pressure is supplied to between the first and second electrodes, there still exist factors that cannot make the above parameters to be held to constant values.

First, discharge craters appear on the surface of the first electrode and that of the second electrode as a result of spark discharge. Thus, the surfaces of the first and second electrodes need to be cleaned or replaced periodically so as to make the above parameters to be held to constant values.

Second, each time the peak value of impulse voltage is to be adjusted, the distance between the first electrode and the second electrode and hence the discharge gap needs to be adjusted. Since the above parameters change when the discharge gap is changed even slightly, the operation of adjusting the discharge gap is very time consuming.

Therefore, it is difficult for an impulse voltage generation device that employs a discharge gap to repeatedly generate an impulse voltage on a stable basis.

Li Ming et al., "EFFECTS OF REPETITIVE PULSE VOLTAGES ON SURFACE TEMPERATURE INCREASE AT END CORONA FPROTECTION REGION OF HIGH VOLTAGE MOTORS", 10th Insucon International Conference Birmingham 2006, describes a circuit for generating a high voltage pulse by means of a semiconductor switch. However, the described circuit is not adapted to realize a test of alternately and repeatedly providing periods during which an impulse voltage is generated and periods during which no impulse voltage is generated.

BRIEF SUMMARY OF THE INVENTION

Thus, the problem to be solved by the present invention is to realize a test of alternately providing periods during which an impulse voltage is repeatedly generated and periods during which no impulse voltage is generated.

According to the present invention, there is presented an impulse voltage generation device comprising: a high voltage generator for generating a high voltage; a capacitive element; a signal generator for generating a combined signal that is generated only in a period where supply of a pulse signal is effected by superimposing a period setting signal whereof one cycle includes a pulse supply period and a pulse idling period subsequent to the pulse supply period on a pulse signal whose frequency is an impulse repetition frequency higher than the frequency of the period setting signal and whose amplitude represents a voltage value that is lower than the high voltage value; and a semiconductor switch for accumulating electric charge on the capacitive element by means of the high voltage from the high voltage generator when the voltage value of the combined signal is lower than the set gate voltage value, generating an impulse voltage whose peak value is the value of the high voltage by means of the electric charge that is discharged from the capacitive element when the voltage value of the combined signal exceeds the set gate voltage value and supplying the impulse voltage between the first output terminal and the second output terminal where a load is provided.

BRIEF DESCRIPTION OF THE DRAWINGS

The above and other features and advantages of the present invention will become apparent from the discussion hereinbelow of specific, illustrative embodiments thereof presented in conjunction with the accompanying drawings, in which.

DETAILED DESCRIPTION OF THE INVENTION

Now, the present invention will be described in greater detail by referring to the accompanying drawings that illustrate preferred embodiments of the invention.

First Embodiment

Figure 8:
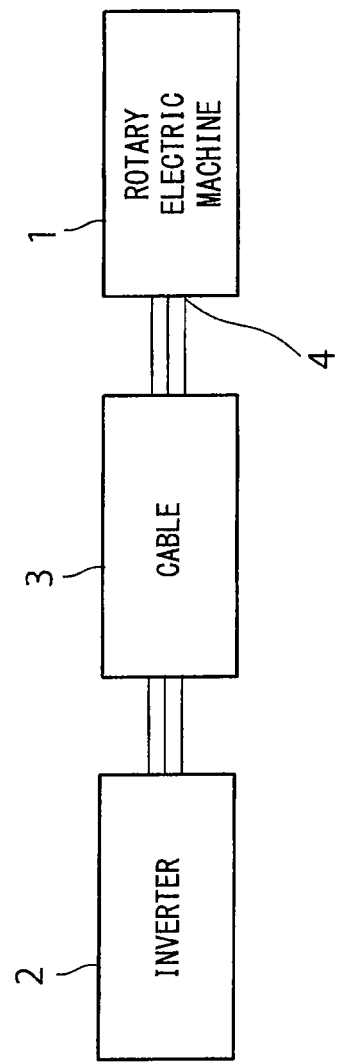
FIG. 8 is a block diagram of a system to which the first embodiment of impulse voltage generation device is applicable, illustrating the configuration thereof.

The first embodiment of impulse voltage generation device according to the present invention is typically applicable to a system illustrated in FIG. 8. The system has a rotary electric machine 1, an inverter 2 and a cable 3.

The cable 3 connects the inverter 2 and the rotary electric machine 1. The rotary electric machine 1 may typically be an electric motor or an electric generator. The inverter 2 converts a DC voltage into a pulse voltage by means of a switching operation and supplies the pulse voltage to the rotary electric machine 1 by way of the cable 3. The rotary electric machine 1 is driven to operate by the pulse voltage.

However, reflected waves are produced by impedance mismatching of the inverter 2, the cable 3 and the rotary electric machine 1. As a reflected wave comes to lie on the pulse voltage, inverter surge can arise at the connecting section 4 where the cable 3 is connected to the rotary electric machine 1.

Such inverter surge has a very short rising time (e.g. between 50 ns and 2 μs) and the falling time is long if compared with the rising time. The frequency at which inverter surge arises repeatedly is typically between 1 kHz and 20 kHz.

Therefore, as a test for evaluating the coil part of the rotary electric machine 1 of the system, there is provided a test in which simulated inverter surge is generated and applied, for example, to the connecting section as load. More specifically, in this test, an impulse voltage is repeatedly generated as simulated surge and periods during which an impulse voltage is generated and periods during which no impulse voltage is generated are alternately provided.

The first embodiment of impulse voltage generation device according to the present invention realizes the above-described test.

Figure 1:
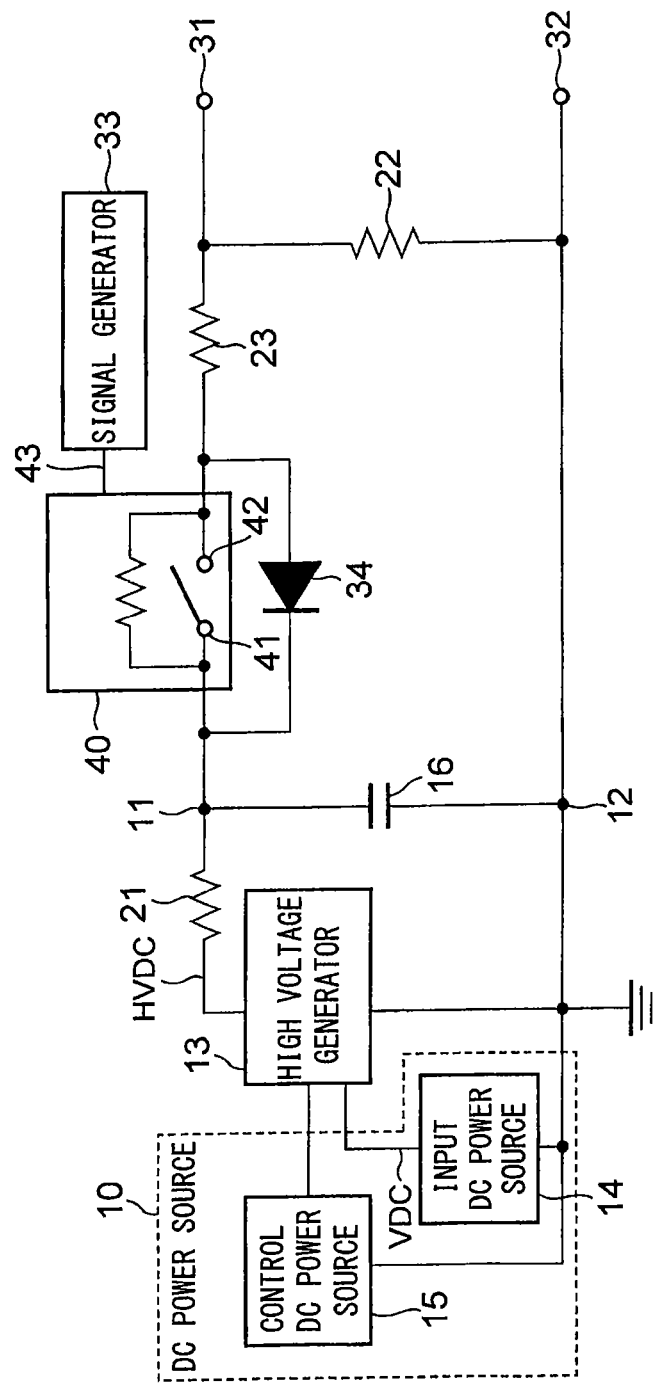
FIG. 1 is a circuit diagram of the first embodiment of impulse voltage generation device according to the present invention, illustrating the configuration thereof.

FIG. 1 is a circuit diagram of the first embodiment of impulse voltage generation device according to the present invention, illustrating the configuration thereof.

As shown in FIG. 1, the first embodiment of impulse voltage generation device has a DC power source 10, a high voltage generator (HVDC) 13, a capacitive element 16, an electric charging resistance element 21, a load resistance element 22, an adjusting resistance element 23, a first output terminal 31, a second output terminal 32, a signal generator 33, a switch inverse voltage protection diode 34 and a semiconductor switch 40.

The output terminal of the high voltage generator 13 is connected to the first electrode (positive electrode) 11 of the capacitive element 16. The second electrode (negative electrode) 12 of the capacitive element 16 is at the electric potential level same as that of the second output terminal 32. More specifically, the second output terminal 32 is grounded. The high voltage generator 13 outputs high voltage HVDC, which will be described hereinafter. The high voltage HVDC shows the electric potential difference from the first electric potential level to the second electric potential level of the high voltage generator 13. In this embodiment, the first electric potential level and the second electric potential level of the high voltage generator 13 are set respectively to 0 [V] and to a high voltage HVDC, and hence both the wiring (not shown) at the first electric potential level side and the cabinet (not shown) of the high voltage generator 13 are grounded.

The DC power source 10 includes an input DC power source 14 and a control DC power source 15.

The output terminal of the input DC power source 14 is connected to the input port (not shown) of the high voltage generator 13. The input DC power source 14 outputs DC voltage VDC as will be described in greater detail hereinafter. DC voltage VDC shows the electric potential difference from the first electric potential level to the second electric potential level of the input DC power source 14. In this embodiment, the first electric potential level and the second electric potential level of the input DC power source 14 are respectively set to 0 [V] and to DC voltage VDC, and hence both the wiring (not shown) at the first electric potential level side and the cabinet (not shown) of the input DC power source 14 are grounded.

The output terminal of the control DC power source 15 is connected to the input port (not shown) of the high voltage generator 13, and the control DC power source 15 outputs a voltage (control signal, which will be described hereinafter) for controlling the value of the electric current that can be made to flow to the high voltage generator 13 by way of the input port. The voltage shows the electric potential difference from the first electric potential level to the second electric potential level of the control DC power source 15. In this embodiment, the first electric potential level and the second electric potential level of the control DC power source 15 are set respectively to 0 [V] and to the aforementioned voltage, and hence both the wiring (not shown) at the first electric potential level side and the cabinet (not shown) of the control DC power source 15 are grounded.

The electric charging resistance element 21 that is a resistance element arranged between the output terminal of the high voltage generator 13 and the first electrode 11 of the capacitive element 16. The load resistance element 22 that is also a resistance element is arranged between the first output terminal 31 and the second output terminal 32. The above-described connecting section 4 where the cable 3 is connected to the rotary electric machine 1 is, for example, arranged between the first output terminal 31 and the second output terminal 32 as load to which an impulse voltage is supplied.

The semiconductor switch 40 has a first terminal 41 connected to the first electrode 11 of the capacitive element 16, a second terminal 42 connected to the first output terminal 31, and a gate terminal 43. A resistance element is arranged between the first terminal 41 and the second terminal 42. The semiconductor switch 40 is turned on and connects the first terminal 41 and the second terminal 42 to each other when the voltage supplied to the gate electrode 43 exceeds a predetermined set gate voltage value.

The adjusting resistance element 23, which is a resistance element, is arranged between the second terminal 42 of the semiconductor switch 40 and the first output terminal 31.

The cathode and the anode of the switch inverse voltage protection diode 34 are respectively connected to the first terminal 41 and the second terminal 42 of the semiconductor switch 40. In other words, the switch inverse voltage protection diode 34 is arranged in parallel with the semiconductor switch 40 to operate as rectification diode.

The output terminal of the signal generator 33 is connected to the gate terminal 43 of the semiconductor switch 40.

Now, the operation of the first embodiment of impulse voltage generation device will be described in terms of the operation of the high voltage generator 13, that of the input DC power source 15 and that of the control DC power source 15.

The DC input power switch 14 generates DC voltage VDC and supplies the DC voltage VDC to the high voltage generator 13.

The high voltage generator 13 generates high voltage HVDC that is proportional to the DC voltage VDC supplied from the input DC power source 14 and higher than the DC voltage DVC (HVDC>>VDC) and applies the high voltage HVDC to the capacitive element 16. The high voltage HVDC is a voltage that is generated according to the presumed peak voltage of inverter surge or a voltage showing a value obtained by multiplying the presumed peak voltage value by a safety factor. The safety factor is also referred to as enhancement factor and, when a system as described above or the coil part of the rotary electric machine 1 of the system is to be rigorously evaluated by a test, a predetermined value, which may 1.3 for example, will be employed as safety factor.

The high voltage generator 13 generates a voltage that is, for example, 3,000 times higher than the DC voltage VDC supplied from the input DC power source 14 as high voltage HVDC. Thus, when the DC voltage VDC is within the range between 0 V and 10 V, the high voltage generator 13 outputs high voltage HVDC that is within the range between 0 V and 30 kV. In other words, when the DC voltage VDC is 10 V, the high voltage generator 13 generates high voltage HVDC of 30 kV, which is 3,000 times higher than the DC voltage VDC of 10 V.

Figure 2:
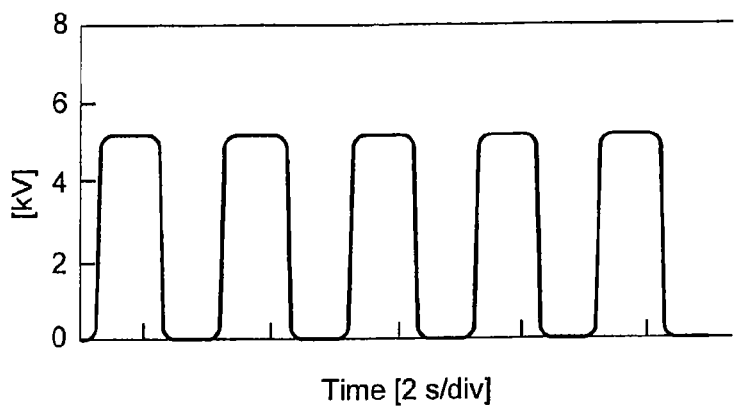
FIG. 2 is a graph illustrating a pulse wave that the input DC power source and the control DC power source of the first embodiment of impulse voltage generation device of the present invention can cause the high voltage generator to generate as a high voltage waveform.
Figure 3:
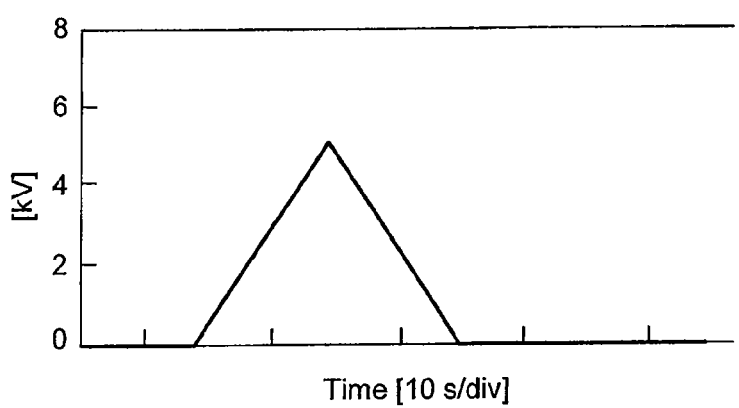
FIG. 3 is a graph illustrating a ramp wave that the first embodiment of impulse voltage generation device of the present invention can cause the high voltage generator to generate as a waveform that is different from the waveform of FIG. 2.
Figure 4:
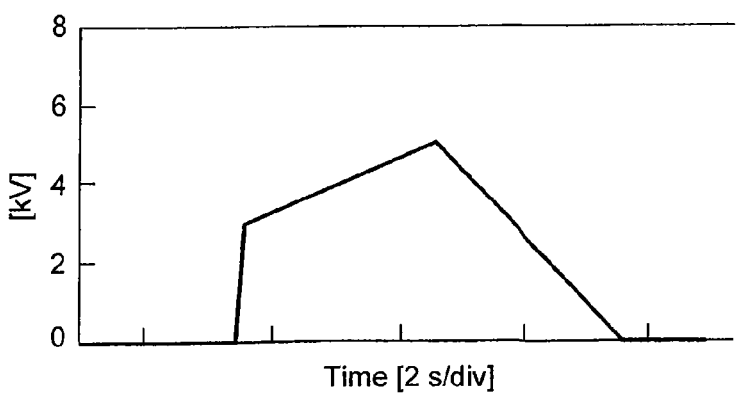
FIG. 4 is a graph illustrating a waveform obtained by combining the pulse wave of FIG. 2 and the ramp wave of FIG. 3 that the first embodiment of impulse voltage generation device can generate.

FIG. 2 is a graph illustrating a pulse wave that the input DC power source 14 can cause the high voltage generator 13 to generate as high voltage HVDC. FIG. 3 is a graph illustrating a ramp wave that can be generated as a waveform that is different from the waveform of FIG. 2. FIG. 4 is a graph illustrating a waveform obtained by combining the pulse wave of FIG. 2 and the ramp wave of FIG. 3. The waveform of FIG. 4 differs from both the waveform of FIG. 2 and that of FIG. 3.

Figure 5:
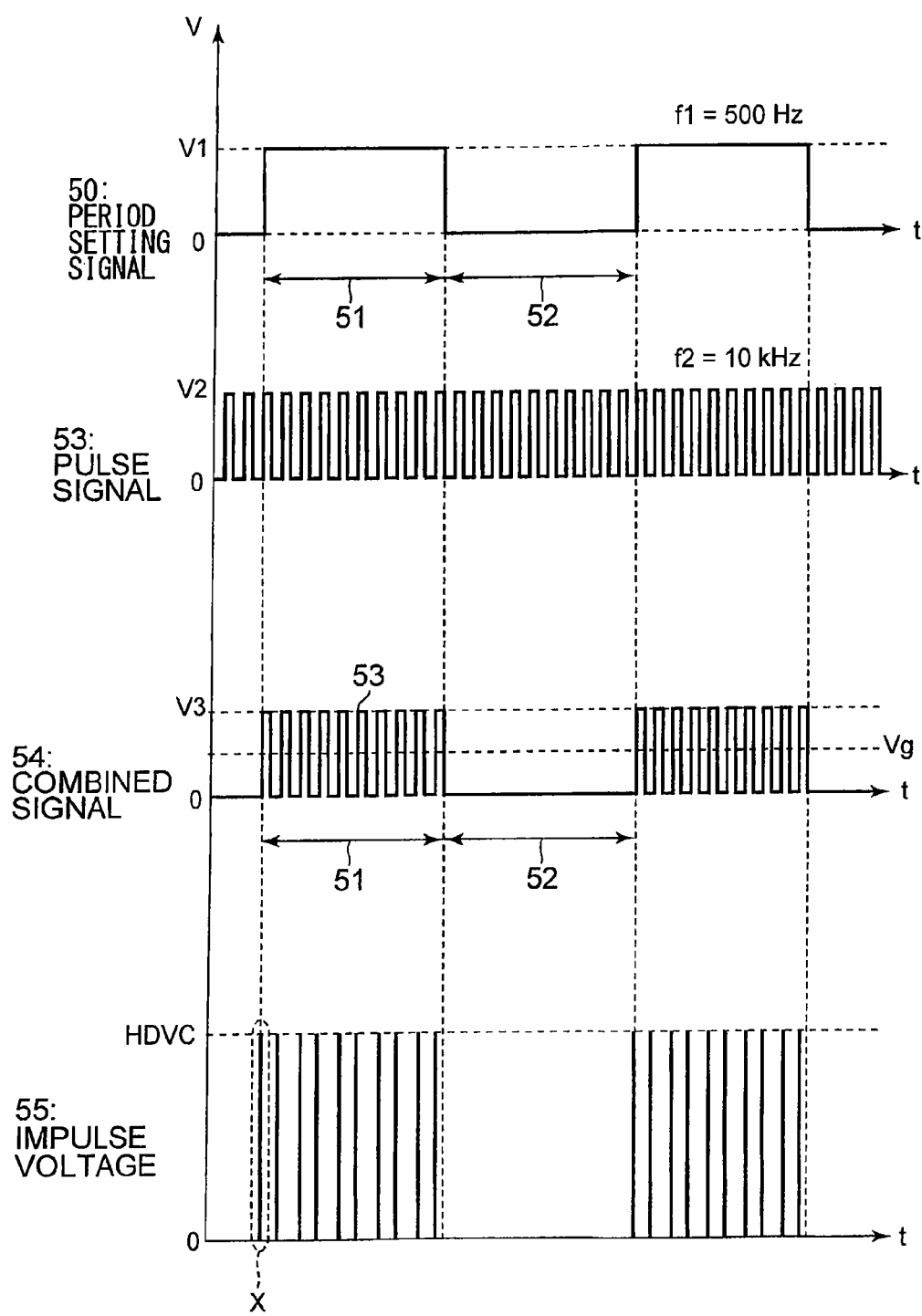
FIG. 5 is a graph illustrating a period setting signal and a pulse signal that the signal generator generates, a combined signal that the signal generator produces and an impulse voltage that the semiconductor switch generates according to the combined signal in the first embodiment of impulse voltage generation device.

The control DC power source 15 outputs a control signal for specifying the voltage value, the rising time and the falling time of the DC voltage VDC to the input DC power source 14. As shown in FIGS. 3 through 5, the control DC power source 15 can alter the waveform of the high voltage HVDC to that of a pulse wave, that of a ramp wave or that of a wave obtained by combining a pulse wave and a ramp wave other than a certain high voltage HVDC, by adjusting the voltage value, the rising time and the falling time of the DC voltage VDC.

In this embodiment, the control DC power switch 15 can specify the largest value for the electric current that flows to the high voltage generator 13.

Now, the operation of the first embodiment of impulse voltage generation device will be described in terms of the operation of the signal generator 33 and that of the semiconductor switch 40.

First, the operation of the signal generator 33 will be described.

FIG. 5 is a graph illustrating period setting signal 50 and pulse signal 53 that the signal generator 33 generates, combined signal 54 that the signal generator 33 produces and impulse voltage 55 that the semiconductor switch 40 generates according to the combined signal 54 in the first embodiment of impulse voltage generation device.

Predetermined frequency f1 is preset as the first frequency and the first voltage value V1 is preset as the first amplitude in the signal generator 33. When the predetermined frequency f1 is set, the signal generator 33 generates a period setting signal 50 having a waveform (function) as shown in FIG. 5.

As for the period setting signal 50, the frequency thereof is equal to the predetermined frequency f1 and the amplitude thereof is equal to the first voltage value V1. A cycle period of the period setting signal 50 includes a pulse supply period 51 and a pulse idling period 52 that comes after the pulse supply period 51.

When the period setting signal 50 shows the waveform of a square wave, the pulse supply period 51 is a period that indicates the first voltage value V1, which is equal to the amplitude value of the period setting signal 50, whereas the pulse idling period 52 is a period that does not show any amplitude value. As long as a cycle period of the period setting signal 50 can be divided into a pulse supply period 51 and a pulse idling period 52, the waveform of the period setting signal 50 is not limited to that of a square wave and may alternatively be that of a sinusoidal wave or that of a triangular wave.

Additionally, impulse repetition frequency f2 that is higher than the predetermined frequency f1 is preset as the second frequency (f2>f1) and the second voltage value V2 is preset as the second amplitude value in the signal generator 33. The impulse repetition frequency f2 is a frequency that is determined on an assumption that inverter surge as described above occurs repetitively (e.g., with a frequency between 1 kHz and 20 kHz). Once impulse repetition frequency f2 and the second voltage value V2 are set, the signal generator 33 generates a pulse signal 53 as shown in FIG. 5.

As for the pulse signal 53, the frequency thereof is equal to the impulse repetition frequency 12 and the amplitude thereof is equal to the second voltage value V2. Thus, when the predetermined frequency f1 is 500 Hz, the impulse repetition frequency 12 is equal to 10 kHz, for example.

When the signal generator 33 generates pulse signal 53, it lays the pulse signal 53 and the period setting signal 50 one on the other to produce a combined signal 54 as shown in FIG. 5. That is, the pulse signal 53 and the period setting signal 50 are multiplied to produce a combined signal 54. The combined signal 54 is supplied to the gate terminal 43 of the semiconductor switch 40. Note that a combined signal 54 is generated only in the pulse supply period 51 of a pulse signal 53.

The voltage value of the combined signal 54, or the third voltage value V3, indicates the second voltage value V2 (V3=V2) of the pulse signal 53 or the logical product of the first voltage value V1 of the period setting signal 50 and the second voltage value V2 of the pulse signal 53 (V3=V1 and V2). The third voltage value V3 is determined by the combination of the set gate voltage value Vg for turning on the semiconductor switch 40 (e.g., 5 V) and the specification of the signal generator 33 so as to be significantly lower than the value of the high voltage HVDC and higher than the set gate voltage value Vg (Vg<V3<<HVDC).

Now, the operation of the semiconductor switch 40 will be described below.

Assume here that a first control signal is generated from the input DC power source 14. This first control signal causes the high voltage generator 13 to generate a first high voltage (e.g., 10 kV), which is high voltage HVDC, during pulse supply period 51, which is referred to here as the first pulse supply period. In other words, when a first DC voltage (3.3 V), which shows the voltage value, the rising time and the falling time specified by the first control signal generated from the input DC power source 14, is supplied to the high voltage generator 13, the high voltage generator 13 generates a voltage that is 3,000 times higher the first DC voltage (3.3 V) as the first high voltage (10 kV). However, note that, when the value of the electric current that flows to the high voltage generator 13 exceeds the electric current value specified at the control DC power source 15, the high voltage generator 13 does not generate any first high voltage (10 kV), which is high voltage HVDC.

The semiconductor switch 40 is turned off and does not connect (or does disconnect) the first terminal 41 and the second terminal 42 when the third voltage value V3, which is the voltage value of the combined signal 54 supplied to the gate terminal 43, is lower than the set gate voltage value Vg. At this time, electric charge is accumulated between the first electrode 11 and the second electrode 12 of the capacitive element 16 due to the high voltage HVDC {the first high voltage (10 kV) in this instance} applied to the capacitive element 16 from the high voltage generator 13. In other words, the semiconductor switch 40 electrically charges the capacitive element 16.

The semiconductor switch 40 is turned on to connect the first terminal 41 and the second terminal 42 when the third voltage value V3 of the combined signal 54 supplied to the gate terminal 43 is not lower than the set gate voltage value Vg. In this instance, the first electrode 11 of the capacitive element 16 is connected to the first output terminal 31 by way of the semiconductor switch 40 and the adjusting resistance element 23. At this time, the electric charge that has been accumulated in the capacitive element 16 is released. In other words, the semiconductor switch 40 discharges the capacitive element 16.

As a result, the semiconductor switch 40 generates an impulse voltage 55 having a peak value equal to the value of the above-described high voltage HVDC {the first high voltage (10 kV)} as shown in FIG. 5 and outputs the impulse voltage 55 between the first output terminal 31 and the second output terminal 32.

Figure 6:
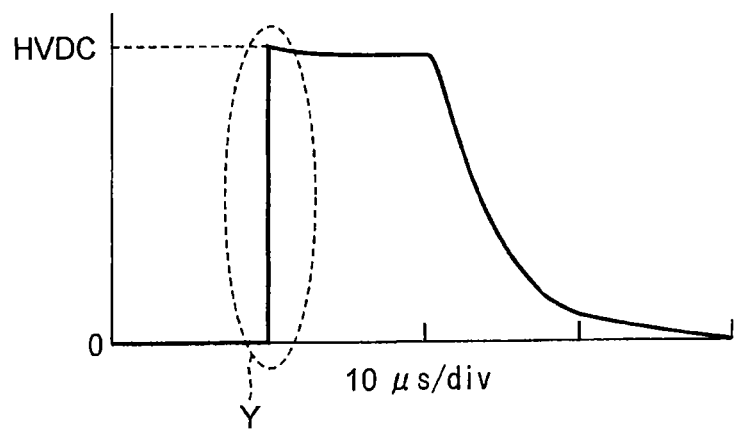
FIG. 6 is a graph illustrating the part indicated by "X" in FIG. 5 of the impulse voltage that the first embodiment of impulse voltage generation device generates, the part being enlarged.
Figure 7:
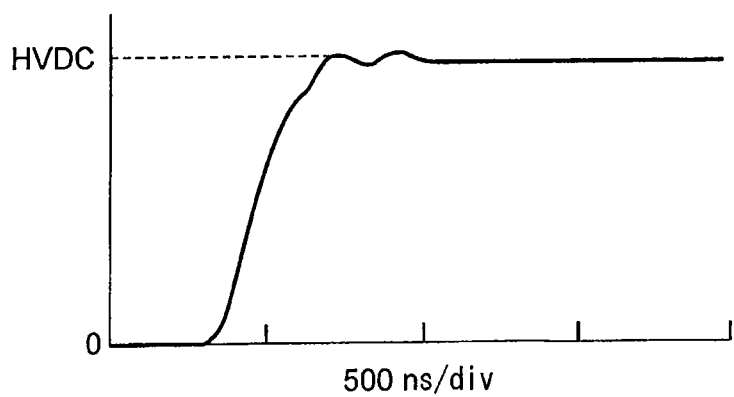
FIG. 7 is a graph illustrating the part indicated by "Y" in FIG. 6 of the impulse voltage that the first embodiment of impulse voltage generating device generates, the part being also enlarged.

FIG. 6 is a graph illustrating the part indicated by "X" in FIG. 5 of the impulse voltage 55, the part being enlarged. FIG. 7 is a graph illustrating the part indicated by "Y" in FIG. 6 of the impulse voltage 55, showing how the impulse voltage 55 rises, the part being also enlarged.

As shown in FIGS. 6 and 7, the impulse voltage 55 has a very short rising time (e.g. between 20 ns and 200 ns) but the falling time thereof is longer (e.g., 20 μs) if compared with the rising time. The impulse width (the time period from the time when the impulse voltage 55 ends rising to the time it starts falling) is between 1 μs and 10 μs and the impulse repetition frequency f2 is between 1 kHz and 20 kHz (10 kHz in the above-described instance).

As described above, the first embodiment of impulse voltage generation device can realize a test of alternately providing pulse supply period 51 periods during which a stable impulse voltage 55 is repeatedly generated and pulse idling periods 52 during which no impulse voltage 55 is generated. Additionally, the first embodiment of impulse voltage generation device can accurately evaluate a system of the above-described type by causing the impulse voltage 55 to be generated repeatedly.

Furthermore, the first embodiment of impulse voltage generation device can realize a test in which the high voltage HVDC is gradually and sequentially raised in a series of pulse supply periods 51.

Assume here, for example, that the second control signal is generated after the first control signal from the input DC power source 14. Then, the second control signal causes the high voltage generator 13 to generate a second high voltage in the second pulse supply period, which is the pulse supply period 51 that comes next to the first pulse supply period. The second high voltage is also a high voltage HVDC but different from the first high voltage that is generated during the first pulse supply period {e.g., 12 kV and hence higher than the first high voltage (10 kV)}. Thus, when a second DC voltage (4.0 V) showing the voltage value, the rising time and the falling time specified by the second control signal generated from the input DC power source 14 is supplied to the high voltage generator 13, the high voltage generator 13 generates the second high voltage (12 kV) that is 3,000 times higher than the second DC voltage (4.0 V) in response to the second DC voltage (4.0). However, note that, when the value of the electric current that flows to the high voltage generator 13 exceeds the electric current value specified at the control DC power source 15, the high voltage generator 13 does not generate any second high voltage (12 kV), which is high voltage HVDC.

The semiconductor switch 40 is turned off and does not connect (or does disconnect) the first terminal 41 and the second terminal 42 when the third voltage value V3, which is the voltage value of the combined signal 54 supplied to the gate terminal 43, is lower than the set gate voltage value Vg. At this time, electric charge is accumulated between the first electrode 11 and the second electrode 12 of the capacitive element 16 due to the high voltage HVDC {the second high voltage (12 kV) in this instance} applied to the capacitive element 16 from the high voltage generator 13. In other words, the semiconductor switch 40 electrically charges the capacitive element 16.

The semiconductor switch 40 is turned on to connect the first terminal 41 and the second terminal 42 when the third voltage value V3 of the combined signal 54 supplied to the gate terminal 43 is not lower than the set gate voltage value Vg. In this instance, the first electrode 11 of the capacitive element 16 is connected to the first output terminal 31 by way of the semiconductor switch 40 and the adjusting resistance element 23. At this time, the electric charge that has been accumulated in the capacitive element 16 is released or discharged.

As a result, the semiconductor switch 40 generates an impulse voltage 55 having a peak value equal to the value of the above-described high voltage HVDC {the second high voltage (12 kV)} and outputs the impulse voltage 55 between the first output terminal 31 and the second output terminal 32.

In the first embodiment of impulse voltage generation device, the input DC power source 14 causes the high voltage generator 13 to generate, for example, the first through sixth high voltages (10 kV, 12 kV, 14 kV, 16 kV, 18 kV and 20 kV) respectively in the first through sixth pulse supply periods 51 as high voltages HVDC in order to realize a test in which the high voltage HVDC is gradually and sequentially raised in a series of pulse supply periods 51. Then, as a result, the semiconductor switch 40 causes an impulse voltage 55 such as the above-described one to be repeatedly generated in each of the first through sixth pulse supply periods 51 according to the combined signals 54 produced by the signal generator 33 by means of switching operations.

The first embodiment of impulse voltage generation device can also realize a test in which the high voltage HVDC is gradually and sequentially raised in a series of pulse supply periods 51 and then the high voltage HVDC is gradually and sequentially lowered in the series of pulse supply periods subsequent to the former series at a predetermined or arbitrarily selected timing. In such an instance, for example, the input DC power source 14 causes the high voltage generator 13 to generate the first through sixth high voltages (10 kV, 12 kV, 14 kV, 16 kV, 18 kV and 20 kV) as high voltage HVDC that is gradually and sequentially raised in the first through sixth pulse supply periods 51 respectively. Then, the input DC power source 14 causes the high voltage generator 13 to generate the seventh through eleventh high voltage (18 kV, 16 kV, 14 kV, 12 kV and 10 kV) as high voltage HVDC that is gradually and sequentially lowered in the seventh through eleventh pulse supply periods 51 respectively. Then, as a result, the semiconductor switch 40 causes an impulse voltage 55 such as the above-described one to be repeatedly generated in each of the first through eleventh pulse supply periods 51 according to the combined signals 54 produced by the signal generator 33 by means of switching operations.

Additionally, the first embodiment of impulse voltage generation device can also realize a test in which the high voltage HVDC is gradually and sequentially raised in a series of pulse supply periods 51 and then held to a constant level in the series subsequent to the former series at a predetermined or arbitrarily selected timing. In such an instance, for example, the input DC power source 14 causes the high voltage generator 13 to generate the first through sixth high voltages (10 kV, 12 kV, 14 kV, 16 kV, 18 kV and 20 kV) as high voltage HVDC that is gradually and sequentially raised in the first through sixth pulse supply periods 51 respectively. Then, the input DC power source 14 causes the high voltage generator 13 to generate the sixth high voltage (20 kV) as high voltage HVDC that is held to a constant level in the seventh through eleventh pulse supply periods 51. Then, as a result, the semiconductor switch 40 causes an impulse voltage 55 such as the above-described one to be repeatedly generated in each of the first through eleventh pulse supply periods according to the combined signals 54 produced by the signal generator 33 by means of switching operations.

Furthermore, the first embodiment of impulse voltage generation device can also realize a test in which the high voltage HVDC is gradually and sequentially lowered in a series of pulse supply periods 51 and then held to a constant level in the series subsequent to the former series at a predetermined or arbitrarily selected timing. In such an instance, for example, the input DC power source 14 causes the high voltage generator 13 to generate the first through sixth high voltages (20 kV, 18 kV, 16 kV, 14 kV, 12 kV and 10 kV) as high voltage HVDC that is gradually and sequentially lowered in the first through sixth pulse supply periods 51 respectively. Then, the input DC power source 14 causes the high voltage generator 13 to generate the sixth high voltage (10 kV) as high voltage that is held to a constant level in the seventh through eleventh pulse supply periods 51. Then, as a result, the semiconductor switch 40 causes an impulse voltage 55 such as the above-described one to be repeatedly generated in each of the first through eleventh pulse supply periods according to the combined signals 54 produced by the signal generator 33 by means of switching operations.

In this way, the first embodiment of impulse voltage generation device can realize a test of alternately providing pulse supply period 51 during which a stable impulse voltage 55 is repeatedly generated and pulse idling periods 52 during which no impulse voltage 55 is generated. Additionally, the first embodiment of impulse voltage generation device can cause a plurality of kinds of impulse voltage 55 to be generated in the series of pulse supply periods 51.

Figure 9:
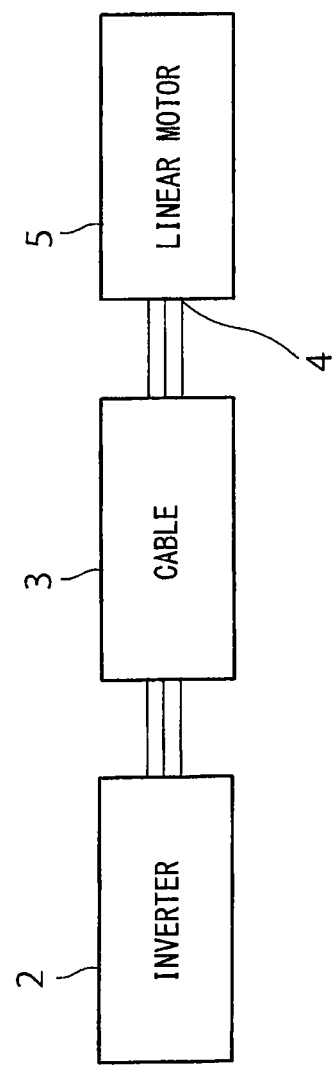
FIG. 9 is a block diagram of a system which is different from the system of FIG. 8 and to which the first embodiment of impulse voltage generation device is applicable, illustrating the configuration thereof.

The first embodiment of impulse voltage generation device is also applicable, for instance, to a system as illustrated in FIG. 9 in addition to the above-described system (see FIG. 8).

FIG. 9 illustrates the configuration of a system to which the first embodiment of impulse voltage generation device can be applied, as an instance different from the system of FIG. 8.

The system has a linear motor 5 in place of the above-described rotary electric machine 1 of the former system. Such a linear motor can find applications including magnetic levitation vehicles. In the system, the cable 3 connects the inverter 2 and the linear motor 5 or the coil part thereof. The inverter 2 converts a DC voltage into a pulse voltage by means of a switching operation and supplies the pulse voltage to the linear motor 5 by way of the cable 3. The linear motor 5 is driven to operate by the pulse voltage.

Second Embodiment

Now the second embodiment of the present invention will be described only in terms of the differences between the first embodiment and the second embodiment.

Figure 10:
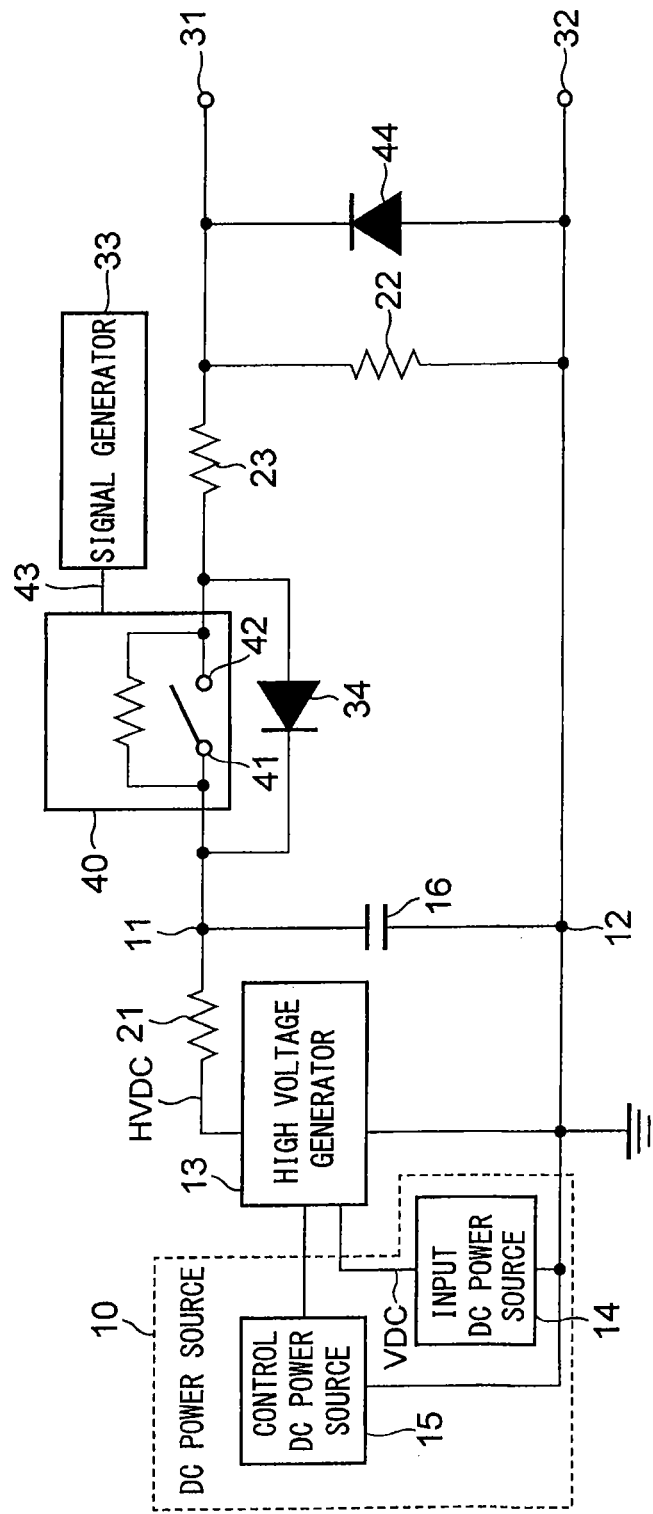
FIG. 10 is a circuit diagram of the second embodiment of impulse voltage generation device according to the present invention, illustrating the configuration thereof.
Figure 11:
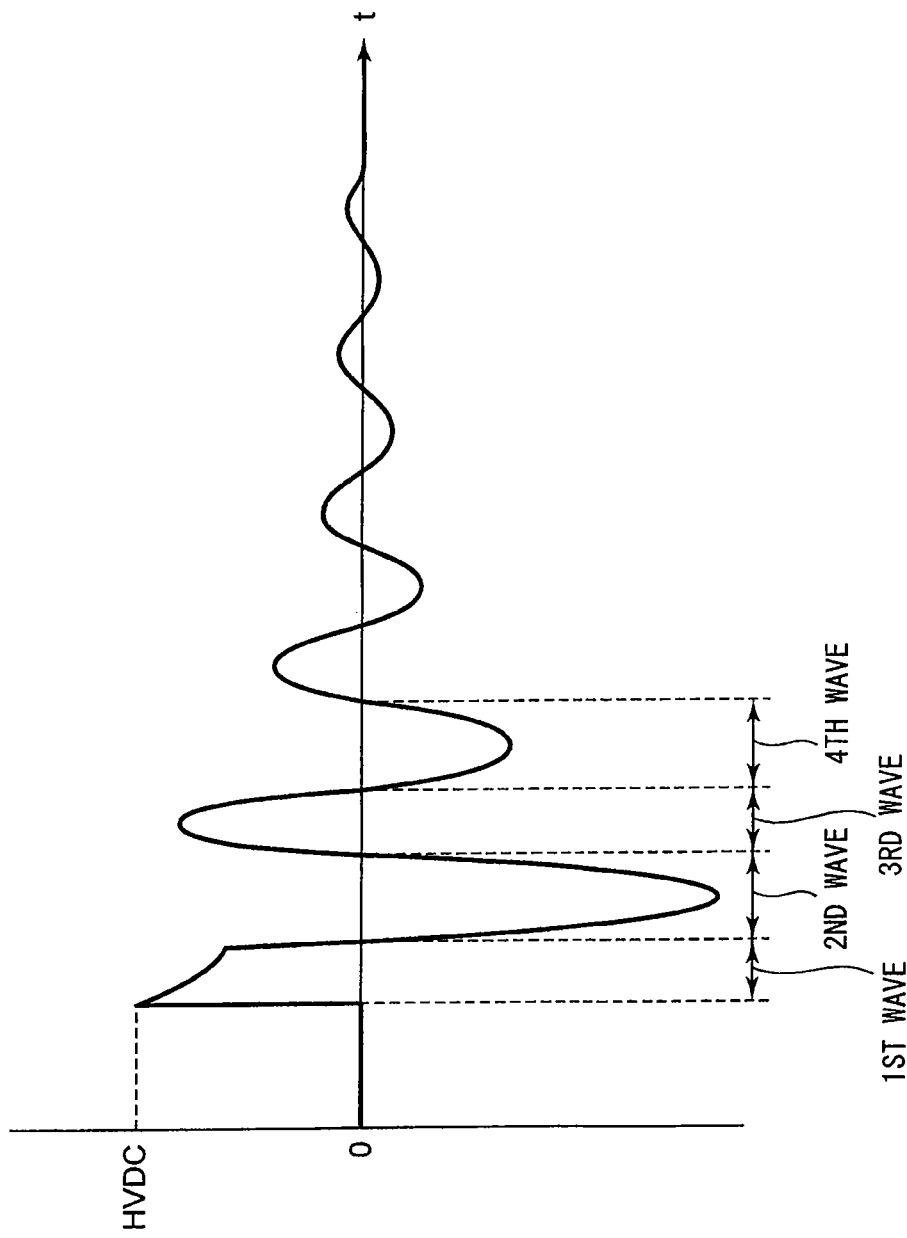
FIG. 11 is a graph illustrating the part indicated by "X" in FIG. 5 of the impulse voltage that the first embodiment of impulse voltage generation device generates, the part being enlarged, when the load includes an inductance component.
Figure 12:
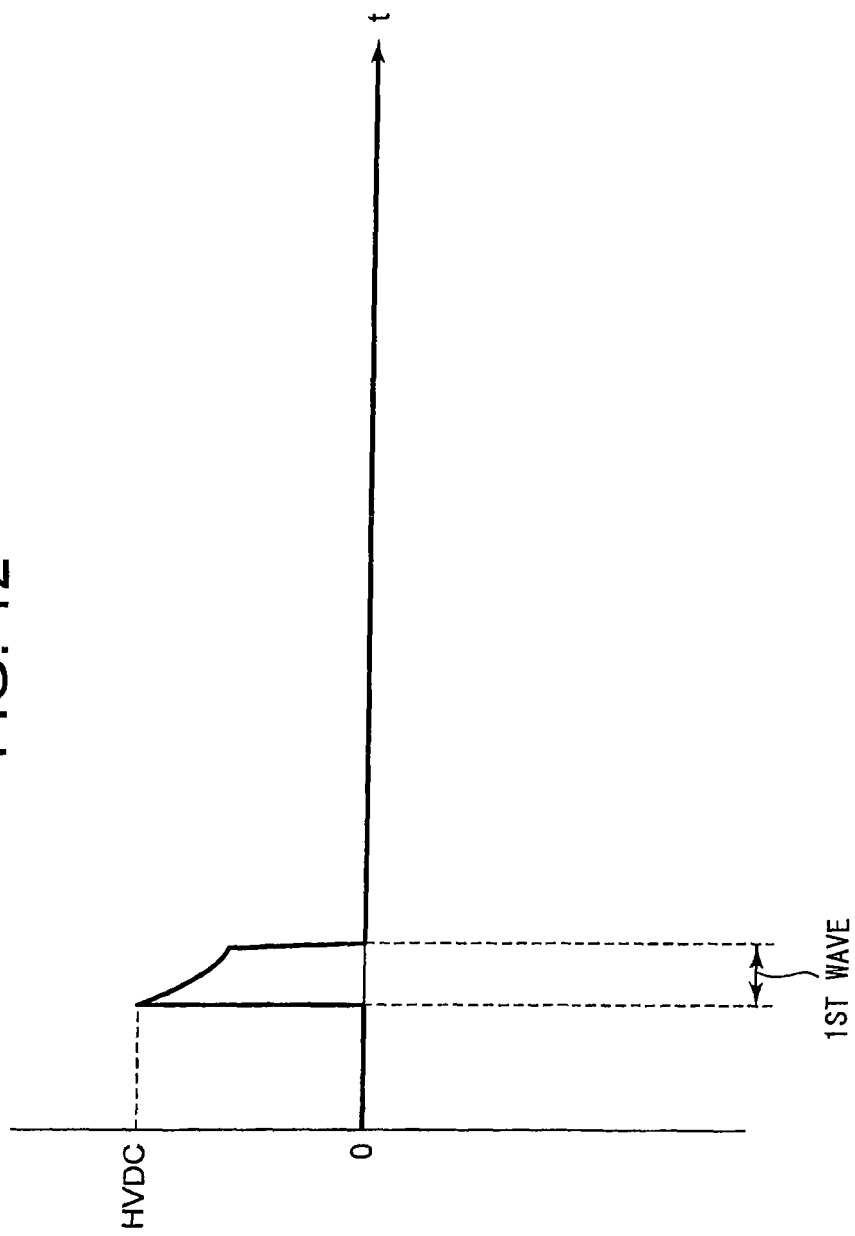
FIG. 12 is a graph illustrating the part indicated by "X" in FIG. 5 of the impulse voltage that the second embodiment of impulse voltage generation device generates, the part being enlarged, when the load includes an inductance component.

FIG. 10 is a circuit diagram of the second embodiment of impulse voltage generation device according to the present invention, illustrating the configuration thereof. FIG. 11 is a graph illustrating the part indicated by "X" in FIG. 5 of the impulse voltage that the first embodiment of impulse voltage generation device generates, the part being enlarged, when the load includes an inductance component. FIG. 12 is a graph illustrating the part indicated by "X" in FIG. 5 of the impulse voltage that the second embodiment of impulse voltage generation device generates, the part being enlarged, when the load includes an inductance component.

As shown in FIG. 10, the second embodiment of impulse voltage generation device differs from the first embodiment in that it additionally has a load inverse voltage protection diode 44. The cathode and the anode of the load inverse voltage protection diode 44 are connected respectively to the first output terminal 31 and the second output terminal 32. In other words, the load inverse voltage protection diode 44 is arranged in parallel with the load resistance element 22 and the load to operate as a rectification diode.

As for the above-described first embodiment of impulse voltage generation device, when the load between the first output terminal 31 and the second output terminal 32 includes an inductance component, counter electromotive force arises due to the inductance component. Therefore, as shown in FIG. 11, when an impulse voltage 55 is generated in a pulse supply period 51, voltages in the form of the second wave, the third wave and so on appear after the appearance of the first wave showing a peak value of positive polarity high voltage HVDC and before the voltage falls to the stable level of 0 [V]. More specifically, the second wave having a peak value of negative polarity appears after the first wave due to the counter electromotive force generated due to the inductance component. In short, an inverse voltage is generated. Then, the third wave having a peak value of positive polarity, the fourth wave having a peaks value of negative polarity and so on appear successively due to the inverse voltage. However, only the first wave is needed as the impulse voltage 55.

As for the second embodiment of impulse voltage generation device, on the other hand, when the load between the first output terminal 31 and the second output terminal 32 includes an inductance component, the load inverse voltage protection diode 44 prevents any inverse voltage from arising. Therefore, when an impulse voltage 55 is generated in a pulse supply period 51, only the first wave showing a peak value of positive polarity high voltage HVDC appears regardless of the load that includes an inductance component, as illustrated in FIG. 12. Thus, the second embodiment of impulse voltage generation device can provide an impulse voltage 55 that includes only the necessary component.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the above explanation, the reference symbols are as follows:
1: rotary electric machine
2: inverter
3: cable
4: connecting section
5: linear motor
10: DC power source
11: first electrode (positive electrode)
12: second electrode (negative electrode)
13: high voltage generator
14: input DC power source
15: control DC power source
16: capacitive element
21: electric charging resistance element
22: load resistance element
23: adjusting resistance element
31: first output terminal
32: second output terminal
33: signal generator
34: switch inverse voltage protection diode
40: semiconductor switch
41: first terminal
42: second terminal
43: gate terminal
44: load inverse voltage protection diode
50: period setting signal
51: pulse supply period
52: pulse idling period
53: pulse signal
54: combined signal
55: impulse voltage
f1: predetermined frequency
f2: impulse repetition frequency
HVDC: high voltage
V1: first voltage value
V2: second voltage value
V3: third voltage value
VDC: DC voltage
Vg: set gate voltage value

What is claimed is:

1. An impulse voltage generation device comprising:
a high voltage generator for generating a high voltage;
a capacitive element;
a signal generator for generating a combined signal that is generated only in a period where supply of a pulse signal is effected by superimposing a period setting signal whereof one cycle includes a pulse supply period and a pulse idling period subsequent to the pulse supply period on a pulse signal whose frequency is an impulse repetition frequency higher than the frequency of the period setting signal and whose amplitude represents a voltage value that is lower than the high voltage value; and
a semiconductor switch for accumulating electric charge on the capacitive element by means of the high voltage from the high voltage generator when the voltage value of the combined signal is lower than the set gate voltage value, generating an impulse voltage whose peak value is the value of the high voltage by means of the electric charge that is discharged from the capacitive element when the voltage value of the combined signal exceeds the set gate voltage value and supplying the impulse voltage between the first output terminal and the second output terminal where a load is provided.

2. The impulse voltage generation device according to claim 1, wherein
the output of the high voltage generator is connected to the first electrode of the capacitive element; and
the semiconductor switch has: a first terminal connected to the first electrode of the capacitive element, a second terminal connected to the first output terminal, and a gate terminal connected to the output of the signal generator such that the semiconductor switch is configured to disconnect the first electrode of the capacitive element and the first output terminal by way of the semiconductor switch when the voltage value of the combined signal supplied to the gate terminal is lower than the set gate voltage value, so as to accumulate electric charge between the first electrode and the second electrode of the capacitive element by means of the high voltage from the high voltage generator, but the semiconductor switch is configured to connect the first electrode of the capacitive element and the first output terminal by way of the semiconductor switch when the voltage value of the combined signal supplied to the gate terminal is not lower than the set gate voltage value to discharge the electric charge accumulated in the capacitive element, so as to generate the impulse voltage whose peak value is equal to the high voltage value by means of the electric charge discharged from the capacitive element, and to supply the impulse voltage between the first output terminal and the second output terminal that is at an electric potential level same as the electric potential level of the second electrode of the capacitive element.

3. The impulse voltage generation device according to claim 2, further comprising:

an electric charging resistance element that is a resistance element arranged between the output of the high voltage generator and the first electrode of the capacitive element;

a load resistance element that is a resistance element arranged between the first output terminal and the second output terminal; and an adjusting resistance element that is a resistance element arranged between the second terminal of the semiconductor switch and the first output terminal.

4. The impulse voltage generation device according to claim 2, further comprising:

a switch inverse voltage protection diode whose cathode and anode are connected respectively to the first terminal and the second terminal of the semiconductor switch.

5. The impulse voltage generation device according to claim 1, further comprising:

a DC power source for generating a DC voltage;

the high voltage generator being adapted to generate a high voltage that is proportional to the DC voltage supplied from the DC power source and higher than the DC voltage.

6. The impulse voltage generation device according to claim 5, wherein the DC power source is configured to supply the DC voltage to the high voltage generator according to a voltage value, a rising time and a falling time that are specified in advance to control the high voltage.

7. The impulse voltage generation device according to claim 6, wherein the DC power source is configured:

to supply a first DC voltage that is a DC voltage proportional to the first high voltage in order to cause the high voltage generator to generate the first high voltage that is a high voltage during a first pulse supply period, which is the above defined pulse supply period; and also to supply the second DC voltage that is a DC voltage proportional to the second high voltage in order to cause the high voltage generator to generate a second high voltage that differs from the first high voltage during a second pulse supply period that comes next to the first pulse supply period.

8. The impulse voltage generation device according to claim 1, wherein the impulse voltage generation device is configured so as to be employed to evaluate a system comprising a rotary electric machine, an inverter for outputting a pulse voltage to drive the rotary electric machine and a cable connecting the inverter and the rotary electric machine or to evaluate a coil part of the rotary electric machine in the system; and the high voltage is a voltage determined by assuming the peak voltage value of inverter surge that can arise at a connecting section where the cable is connected to the rotary electric machine or a value obtained by multiplying the peak voltage value by a safety factor, while the impulse repetition frequency is a frequency determined by assuming instances where inverter surges occur repeatedly.

9. The impulse voltage generation device according to claim 1, wherein the impulse voltage generating device is configured to be employed to evaluate a system comprising a linear motor, an inverter for outputting a pulse voltage to drive the linear motor and a cable connecting the inverter and the linear motor or to evaluate a coil part of the linear motor in the system; and the high voltage is a voltage determined by assuming the peak voltage value of inverter surge that can arise at a connecting section where the cable is connected to the rotary electric machine or a value obtained by multiplying the peak voltage value by a safety factor, while the impulse repetition frequency is a frequency determined by assuming instances where inverter surges occur repeatedly.

10. The impulse voltage generation device according to claim 1, further comprising:

a load inverse voltage protection diode whose cathode and anode are connected respectively to the first output terminal and the second output terminal, the load inverse voltage protection diode being arranged in parallel with the load.

* * * * *